United States Patent
Chin

(10) Patent No.: US 8,813,834 B2
(45) Date of Patent: Aug. 26, 2014

(54) QUICK TEMPERATURE-EQULIZING HEAT-DISSIPATING DEVICE

(76) Inventor: Chi-Te Chin, Taichung (TW)

(*) Notice: Subject to any disclaimer, the term of this patent is extended or adjusted under 35 U.S.C. 154(b) by 1241 days.

(21) Appl. No.: 12/453,850

(22) Filed: May 26, 2009

(65) Prior Publication Data
US 2009/0288808 A1    Nov. 26, 2009

(30) Foreign Application Priority Data

May 26, 2008    (TW) .............................. 97209182 U

(51) Int. Cl.
*F28D 15/00*    (2006.01)

(52) U.S. Cl.
USPC .................................................. 165/104.26

(58) Field of Classification Search
USPC .................................................. 165/104.26
See application file for complete search history.

(56) References Cited

U.S. PATENT DOCUMENTS

| | | | | |
|---|---|---|---|---|
| 3,576,210 A | * | 4/1971 | Trent | 165/104.26 |
| 3,735,806 A | * | 5/1973 | Kirkpatrick | 165/104.26 |
| 3,749,159 A | * | 7/1973 | Meijer | 165/104.26 |
| 3,820,596 A | * | 6/1974 | Weinhardt et al. | 165/104.26 |
| 4,046,190 A | * | 9/1977 | Marcus et al. | 165/104.26 |
| 4,207,027 A | * | 6/1980 | Barry et al. | 165/104.26 |
| 4,231,423 A | * | 11/1980 | Haslett | 165/104.26 |
| 4,815,529 A | * | 3/1989 | Miyazaki et al. | 165/104.26 |
| 4,846,263 A | * | 7/1989 | Miyazaki et al. | 165/104.26 |
| 4,899,812 A | * | 2/1990 | Altoz | 165/109.1 |
| 4,941,530 A | * | 7/1990 | Crowe | 165/104.21 |
| 4,944,344 A | * | 7/1990 | Crowe | 165/104.21 |
| 5,346,000 A | * | 9/1994 | Schlitt | 165/104.26 |
| 5,671,804 A | * | 9/1997 | Kordelin | 165/166 |
| 6,082,443 A | * | 7/2000 | Yamamoto et al. | 165/104.26 |
| 6,269,866 B1 | * | 8/2001 | Yamamoto et al. | 165/104.26 |
| 6,397,935 B1 | * | 6/2002 | Yamamoto et al. | 165/104.26 |
| 6,508,302 B2 | * | 1/2003 | Ishida et al. | 165/104.26 |
| 6,725,908 B2 | * | 4/2004 | Suzuki | 165/104.21 |
| 6,725,910 B2 | * | 4/2004 | Ishida et al. | 165/104.26 |
| 6,817,097 B2 | * | 11/2004 | Sarraf et al. | 29/890.032 |
| 6,871,701 B2 | * | 3/2005 | Ueki et al. | 165/104.26 |
| 6,901,994 B1 | * | 6/2005 | Jin-Cherng et al. | 165/104.26 |
| 6,983,791 B2 | * | 1/2006 | Hsu | 165/104.26 |
| 7,044,201 B2 | * | 5/2006 | Cho et al. | 165/104.26 |
| 7,278,469 B2 | * | 10/2007 | Sasaki et al. | 165/104.26 |
| 7,324,341 B2 | * | 1/2008 | Oman | 165/104.26 |
| 7,392,836 B2 | * | 7/2008 | Wong | 165/104.26 |
| 7,420,810 B2 | * | 9/2008 | Reis et al. | 165/104.26 |
| 7,422,053 B2 | * | 9/2008 | Siu | 165/104.26 |
| 7,540,318 B2 | * | 6/2009 | Nitta et al. | 165/104.26 |
| 7,552,759 B2 | * | 6/2009 | Liu et al. | 165/104.26 |
| 7,603,775 B2 | * | 10/2009 | Meng et al. | 29/890.032 |
| 7,650,931 B2 | * | 1/2010 | Siu | 165/104.26 |
| 7,770,630 B2 | * | 8/2010 | Chesser et al. | 165/104.26 |
| 7,770,631 B2 | * | 8/2010 | Wang | 165/104.26 |
| 7,823,286 B2 | * | 11/2010 | Hsu | 165/104.26 |
| 7,845,394 B2 | * | 12/2010 | Chang et al. | 165/104.26 |

(Continued)

*Primary Examiner* — Ljiljana Ciric
(74) *Attorney, Agent, or Firm* — Bacon & Thomas, PLLC

(57) ABSTRACT

A heat-dissipating device includes a hermetic container, a metallic sheet, and two metallic nets. The hermetic container contains a liquid working medium and has an internal top side and an internal bottom side. The metallic sheet is mounted inside the hermetic container, having a plurality of pores running therethrough and a plurality of support pieces protruding outward from its upper and lower surfaces respectively. The two metallic nets are supported by the support pieces to contact against the internal top and bottom sides of the hermetic container.

9 Claims, 3 Drawing Sheets

(56) References Cited

U.S. PATENT DOCUMENTS

| | | | |
|---|---|---|---|
| 7,913,748 B2 * | 3/2011 | Lin et al. | 165/104.26 |
| 8,016,024 B2 * | 9/2011 | Kang et al. | 165/104.26 |
| 8,037,927 B2 * | 10/2011 | Schuette | 165/104.26 |
| 8,074,706 B2 * | 12/2011 | Su et al. | 165/104.26 |
| 8,176,973 B2 * | 5/2012 | Liao | 165/104.26 |
| 8,243,449 B2 * | 8/2012 | Oniki et al. | 165/104.26 |
| 8,316,921 B2 * | 11/2012 | Hou et al. | 165/104.21 |
| 2001/0004934 A1 * | 6/2001 | Yamamoto et al. | 165/104.11 |
| 2003/0024691 A1 * | 2/2003 | Tsay et al. | 165/104.26 |
| 2003/0159806 A1 * | 8/2003 | Sehmbey et al. | 165/104.26 |
| 2007/0163755 A1 * | 7/2007 | Kim et al. | 165/104.26 |
| 2007/0240854 A1 * | 10/2007 | Liu et al. | 165/104.26 |
| 2007/0240860 A1 * | 10/2007 | Meyer et al. | 165/104.26 |

* cited by examiner

QUICK TEMPERATURE-EQULIZING HEAT-DISSIPATING DEVICE

BACKGROUND OF THE INVENTION

1. Field of the Invention

The present invention relates generally to heat-dissipating devices, and more particularly, to a quick temperature-equalizing heat-dissipating device.

2. Description of the Related Art

As the microelectronic technology develops rapidly, the size of linewidth of an IC chip is dramatically reduced and the IC tends to high density and high power. As the master frequency of the chip is increased, high heat flow density is produced and has become the principal bar against the technological development of the high-integration chip. More advanced chip indicates that there are more transistors on the integrated circuit, such that high heat and high power generated will result in high working temperature to reveal the faults resulted from various tiny physical flaws, like bridge fault. Further, the high working temperature will enlarge the interconnect resistance and increase the line delay, such that the delay fault seems serious. Besides, the temperature rise also increases the leakage current and the gate delay and decreases the working voltage to make the delay fault more serious.

In addition, the high frequency and high speed of the electronic component and the density and miniaturization of the large integrated circuit boost the heat generation of unit volume of the electronic component. Under the circumstances, the heat-dissipating technology of the electronic component becomes very crucial to the research and development of the electronic products because the reliability and working performance of the electronic products are subject to the heat-dissipating performance of the electronic component. Some researches demonstrate that the fault rate could drop for 4% as the temperature of the electronic component drops for 1° C.; the fault rate rises for 100% as the temperature rises for 10-20° C.

The heat-dissipating system is very crucial to keeping the electronic chip under normal working temperature and after the electronic chip is designed and packaged, its thermal reliability mainly depends on the heat-dissipating performance of the heat-dissipating system. So far, the conventional heat-dissipating devices include heat sinks, cooling fans, blowers, one-piece fans and radiators, cold plates, fan boxes, thermoelectric refrigeration, heat exchangers, heat pipes, vortex tubes, and air conditioners. To adapt the thermal dissipation to the high heat flow density, the aforesaid conventional heat-dissipating means had been improved and some new heat-dissipating means had been proposed, like hollow plates, liquid cooling plates, and jet impingement cooling systems. However, as the heat flow density is increased and the heat-dissipating space is decreased, the latter heat-dissipating means have failed to keep up with such trend and thus have significantly held the increment of the master frequency of processors or chips.

SUMMARY OF THE INVENTION

The primary objective of the present invention is to provide a quick temperature-equalizing heat-dissipating device, which is structurally simple, low-cost, and subject to batch production and can equally dissipate the high heat flow density generated by electronic components.

The foregoing objective of the present invention is attained by the quick temperature-equalizing heat-dissipating device composed of a hermetic container, a metallic sheet, and two metallic nets. The hermetic container contains a liquid working medium and includes an internal top side and an internal bottom side. The metallic sheet is mounted inside the hermetic container, having a plurality of pores running therethrough and a plurality of support pieces protruding outward from its upper and lower surfaces respectively. The two metallic nets are supported by the support pieces to contact against the internal top and bottom sides of the hermetic container.

DETAILED DESCRIPTION OF PREFERRED EMBODIMENTS

Figure 1:
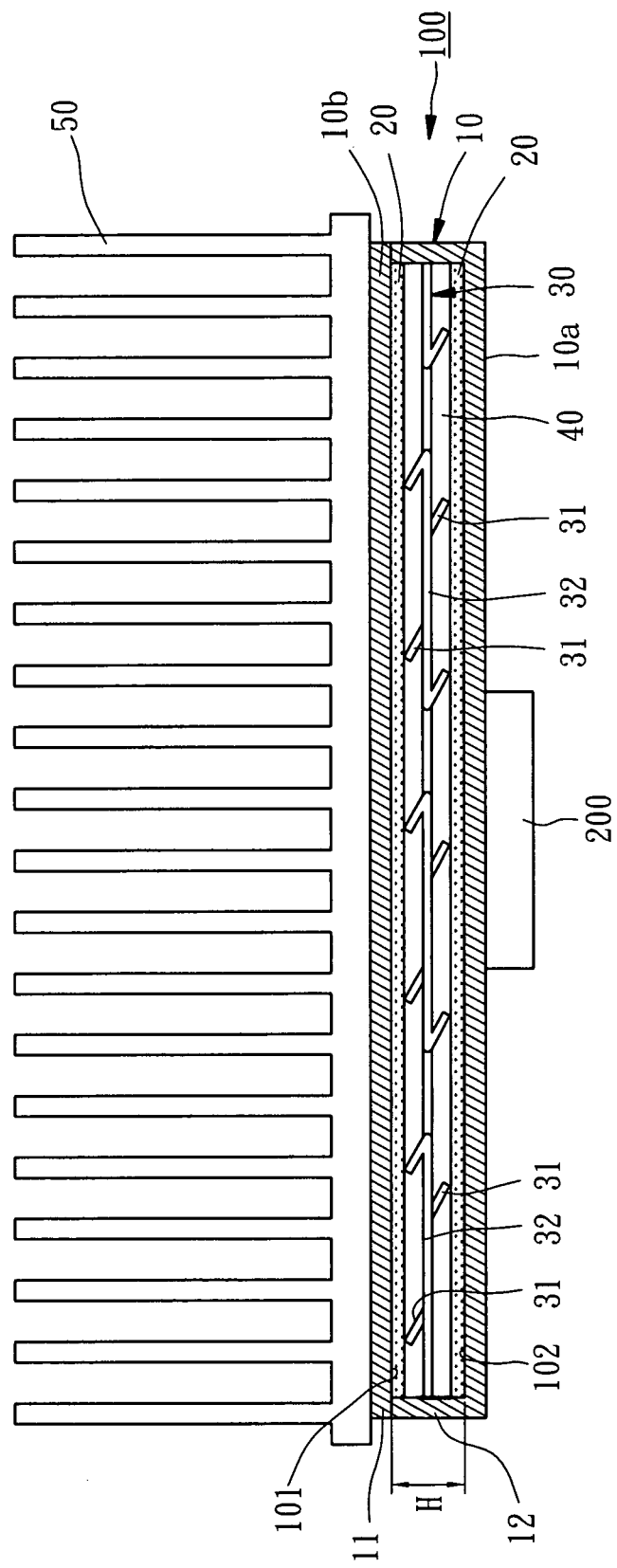
FIG. 1 is a sectional view of a preferred embodiment of the present invention.
Figure 2:
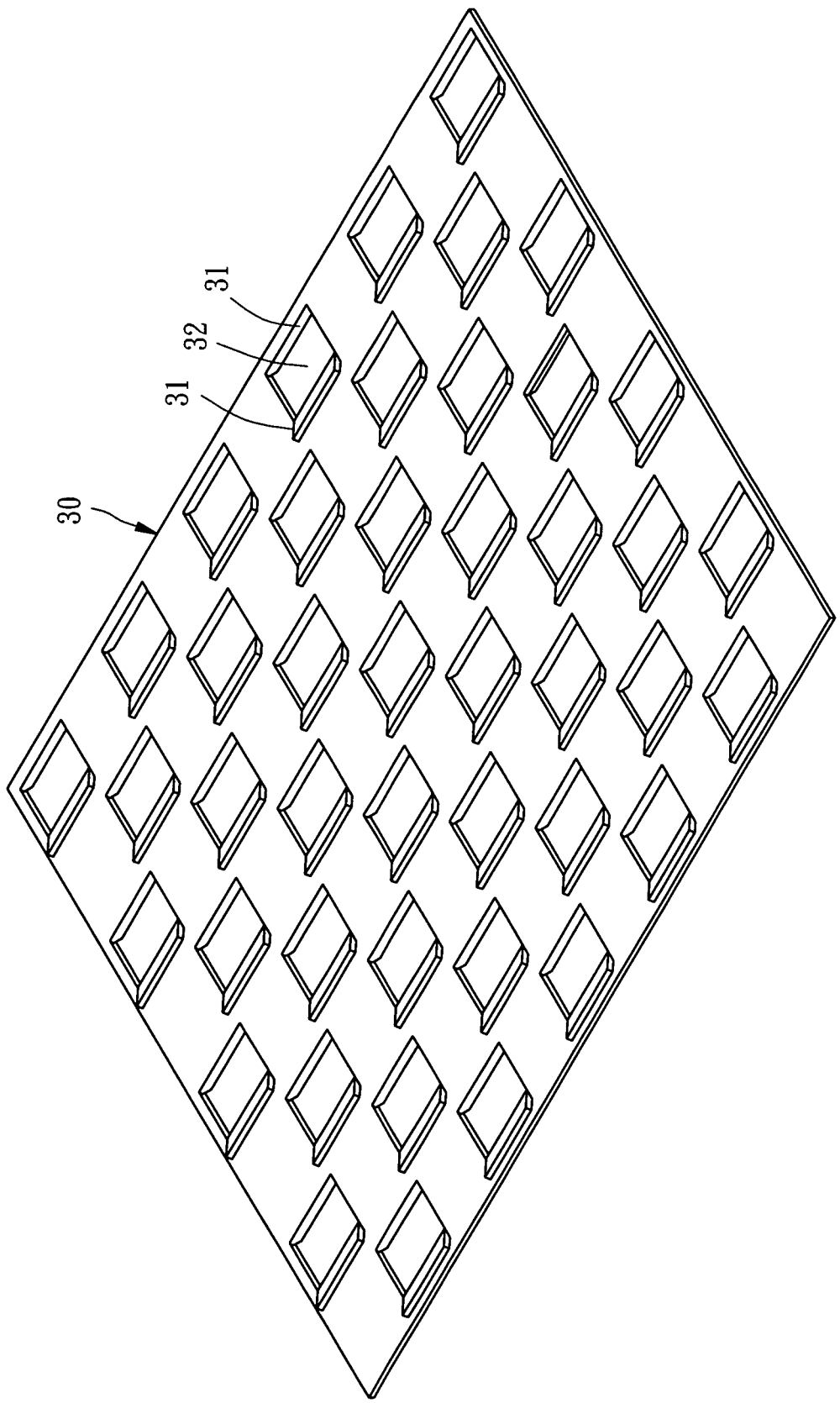
FIG. 2 is a perspective view of a part of the preferred embodiment of the present invention.

Referring to FIG. 1, a quick temperature-equalizing heat-dissipating device 100 for dissipating the heat while an electronic component 200 is running, constructed according to a preferred embodiment of the present invention, is composed of a hermetic container 10, two metallic nets 20, a metallic sheet 30, and a liquid working medium 40.

The hermetic container 10 includes a shell 11 and a cover 12 welded with the shell 11, having a vaporization end 10a and a condensation end 10b. The vaporization end 10a has an external side, to which the electronic component 200 is mounted, and an internal side, which is an internal bottom side 101 of the hermetic container 10. The condensation end 10b has an external side, at which a heat sink 50 is located, and an internal side, which is an internal top side 102 of the hermetic container 10. The heat sink 50 can be either mounted to or formed integrally on the condensation end 10b. The liquid working medium 40 is contained inside the hermetic container 10 and is selected from a group consisting of water, methyl alcohol, ammonia, and Freon. It is to be noted that FIG. 1 shows an upside-down view of the hermetic container 10.

Each of the metallic nets 20 includes 100 meshes and more, depending on the actual requirement. If the metallic net includes more meshes, there will be more meshes per unit area, i.e. the size of the mesh will be smaller; in this way, the liquid working medium 40 can have greater capillary force to heighten reflux rate (Please refer to details mentioned hereunder). It is to be noted that each of the metallic net 20 is formed of sintered metal powers attached to an internal periphery of the hermetic container 10.

Figure 3:
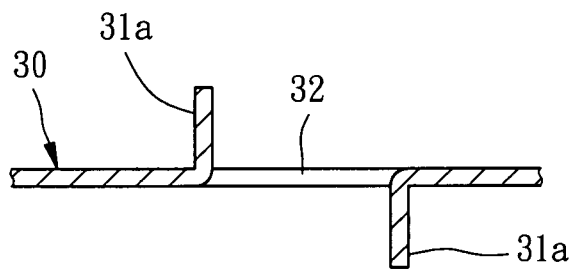
FIG. 3 is a schematic view of a part of the preferred embodiment of the present invention.
Figure 4:
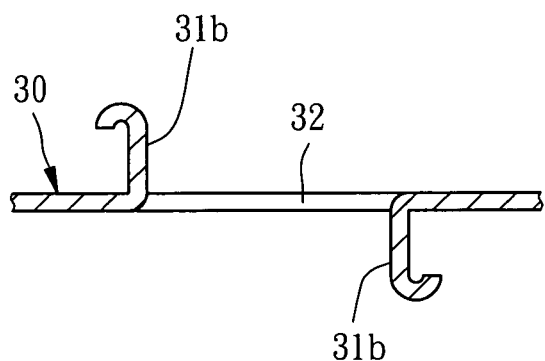
FIG. 4 is similar to FIG. 3, showing another shape of the part.
Figure 5:
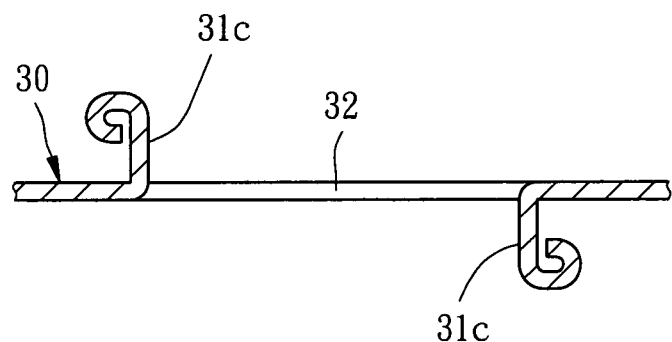
FIG. 5 is similar to FIG. 3, showing another shape of the part.

The metallic sheet 30 is a 3D reinforced structure made by progressive stamping, having a plurality of support pieces 31 protruding outward from its upper and lower surfaces and a plurality of pores 32 running therethrough. The support pieces 31 support the two metallic nets 20 to enable the two metallic nets 20 to contact against the internal top and bottom sides 101 and 102 in such a way that a stack of the metallic sheet 30 and the two metallic nets 20 is formed. In other words, a height H of the stack is larger than or equal to a distance between the internal top and bottom sides of the hermetic container 10 so as to force the two metallic nets 20 to tightly contact against the internal top and bottom sides 101 and 102 of the hermetic container 10. In this way, the quick temperature-equalizing heat-dissipating device 100 can do the thermal dissipation not only by thermal convection of the liquid working medium 40 but also by thermal conduction, thus enhancing the overall heat-dissipating efficiency and reinforcing the structure of the quick temperature-equalizing heat-dissipating device 100. In addition, the distal end of each of the support pieces 31 is bendable without any limitation, such as the support pieces 31a, 31b, and 31c shown in FIGS. 3-5. The pores 32 are provided for guiding the liquid working medium 40 while it is vaporized. The metallic sheet 30 can also be a metallic knitted netting having fewer than 20 meshes or having the meshes of large diameter each.

Each of the hermetic container 10, the metallic sheet 30, and the metallic nets 20 is made of a metal having high thermal conductivity, like cooper, nickel, aluminum, or their compound, for higher heat-dissipating efficiency. A method of making the quick temperature-equalizing heat-dissipating device 100 includes the following steps.
  a) Prepare the shell 11 and the cover 12.
  b) Prepare the metallic sheet 30 by the aggressive stamping to form the pores 32 and the support pieces 31 extending upward and downward.
  c) Sandwich the two metallic nets 20 with the metallic sheet 30, put them into the shell 11, put the cover 12 onto the shell 11, and combine the shell 11 and the cover 12 by welding to form the hermetic container 10 with an injection hole (not shown) reserved beforehand.
  d) Inject the liquid working medium 40 through the injection hole into the hermetic container 10 and vacuumize the hermetic container 10 to form a relatively negative pressure environment inside the hermetic container 10.

To prevent the quick temperature-equalizing heat-dissipating device 100 from deformation resulted from high temperature generated by the welding, the welding is a localized high-temperature welding in this embodiment for securing the structural strength, flatness, stability, and reliability. Further, a chemical etching or surface anodizing treatment can be applied to the hermetic container 10 or the metallic nets 20 or the metallic sheet 30 for generating a highly hydrophilic surface thereon.

When the electronic component is working to generate high temperature, the vaporization end 10a of the heat-dissipating device 100 is heated and then the working medium 40 adsorbs the heat to be vaporized to produce saturated vapor. In the meantime, the saturated vapor rises along the pores 32 to transfer the heat to the condensation end 10b; the vapor becomes little drips after the heat is dissipated by the heat sink 50, and then the drips coheres to the metallic nets 20. After that, the drips flow back to the vaporization end 10a by the capillary action and then contact the metallic sheet 30 via the lower metallic nets 20. Briefly, the quick temperature-equalizing heat-dissipating device 100 functions like repeating the aforesaid vaporization and condensation again and again.

When the electronic component 200 is kept under high temperature or its surface temperature is nonuniform, the pressure and temperature inside the quick temperature-equalizing heat-dissipating device 100 become nonuniform internally. In the meantime, the vaporized fluid of the working medium 40 owing to the pressure difference is quickly distributed to the lower-temperature area and further the heat-dissipating device 100 can adsorb the heat more equally to secure the smooth and rapid process that the working medium 40 flows back to the vaporization end 10a from the condensation end 10b.

It is to be noted that the method of making the quick temperature-equalizing heat-dissipating device 100 is not limited to the stamping of the shell 11 and cover 12 and can be the stamping of a metallic round tube.

In light of the above, the quick temperature-equalizing heat-dissipating device 100 is based on the principle of working medium liquid phase transition to quickly equally dissipate the high heat flow density of the electronic component 200, like a chip, to further lower the surface temperature of the electronic component 200. In this way, the electronic component 200 can be applied to higher integration and run at higher speed, e.g. thermal dissipation of CPU of a computer, or thermal dissipation of an LED lamp. Besides, the heat-dissipating device of the present invention is structurally simple, low-cost in production, and subject to batch production and thus can take the place of the prior art that the heat sink is covered onto the chip.

Although the present invention has been described with respect to a specific preferred embodiment thereof, it is no way limited to the details of the illustrated structures but changes and modifications may be made within the scope of the appended claims.

What the invention claimed is:

1. A quick temperature-equalizing heat-dissipating device comprising:
  a hermetic container containing a liquid working medium and having an internal top side and an internal bottom side;
  a metallic sheet mounted inside the hermetic container, the metallic sheet having a plurality of pores running therethrough, and a plurality of support pieces protruding outward from an upper surface and from a lower surface of said metallic sheet; and
  two metallic nets stopped against both the plurality of support pieces of the metallic sheet and against the internal top side and the internal bottom side of the hermetic container,
  wherein the metallic sheet is disposed between the two metallic nets; and
  wherein each of the metallic nets is formed of sintered metal powders attached to an internal periphery of the hermetic container.

2. The quick temperature-equalizing heat-dissipating device as defined in claim 1, wherein the hermetic container comprises a condensation end and a heat sink located at the condensation end.

3. The quick temperature-equalizing heat-dissipating device as defined in claim 2, wherein the heat sink and the condensation end are formed in one piece.

4. The quick temperature-equalizing heat-dissipating device as defined in claim 1, wherein each of the metallic nets comprises at least 100 meshes.

5. The quick temperature-equalizing heat-dissipating device as defined in claim 1, wherein the support pieces and the pores are formed by stamping in one piece with the metallic sheet.

6. The quick temperature-equalizing heat-dissipating device as defined in claim 1, wherein the metallic sheet comprises meshes fewer than 20.

7. The quick temperature-equalizing heat-dissipating device as defined in claim 1, wherein the metallic sheet is a metallic knitted or stamped netting having meshes of large diameter.

8. The quick temperature-equalizing heat-dissipating device as defined in claim 1, wherein the liquid working medium is selected from the group consisting of water, methyl alcohol, ammonia, and Freon.

9. The quick temperature-equalizing heat-dissipating device as defined in claim 1, wherein each of the hermetic container, the metallic nets, and the metallic sheet is made of copper, nickel, aluminum, or a compound including at least one of copper, nickel and aluminum.

\* \* \* \* \*